(12) United States Patent
Park et al.

(10) Patent No.: US 6,197,636 B1
(45) Date of Patent: Mar. 6, 2001

(54) ELECTRICALLY ERASABLE PROGRAMMABLE READ-ONLY MEMORY DEVICE AND METHOD FOR FABRICATING THE SAME

(75) Inventors: Weon-Ho Park; Jeong-Uk Han, both of Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/525,731

(22) Filed: Mar. 14, 2000

(30) Foreign Application Priority Data

Oct. 7, 1999 (KR) .................................................. 99-43190

(51) Int. Cl.⁷ ................................................ H01L 21/336
(52) U.S. Cl. ............................................. 438/257; 438/264
(58) Field of Search ...................... 438/257, 264

(56) References Cited

U.S. PATENT DOCUMENTS

| | | | |
|---|---|---|---|
| 4,822,750 | * 4/1989 | Perlegos et al. | 438/264 |
| 5,273,923 | 12/1993 | Chang et al. | 437/43 |
| 5,376,573 | * 12/1994 | Richart et al. | 438/264 |
| 5,411,904 | * 5/1995 | Yamauchi et al. | 438/264 |
| 5,427,963 | * 6/1995 | Richart et al. | 438/257 |

* cited by examiner

Primary Examiner—Trong Q. Phan
(74) Attorney, Agent, or Firm—Samuels, Gauthier & Stevens, LLP

(57) ABSTRACT

An electrically erasable programmable read-only memory device comprises a substrate having an active region, a field isolation region for isolating the active region, and extension areas integrally extended and interconnected at portions of the active region in the neighborhood of a tunnel region to enlarge an overlap margin between the active region and tunnel region. A tunnel ion implanted region is formed in a portion of the active region including the tunnel region and a tunnel dielectric film is formed on a portion of the active region corresponding to the tunnel region. A gate dielectric film is formed on the remaining portion of the active region except for the portion corresponding to the tunnel region. A floating gate is formed in common on the tunnel region and active region and a control gate is formed on the floating gate via an insulating film. A selection gate is formed on the gate dielectric film at a predetermined distance from the control gate. A source region, a drain region and a source/drain region are self-aligned with the selection gate and floating gate and formed on the active region. The extension areas serve to prevent misalignment between the active region and tunnel region during fabrication and, furthermore, mitigate degradation in the quality of the tunnel dielectric film.

6 Claims, 5 Drawing Sheets

ELECTRICALLY ERASABLE PROGRAMMABLE READ-ONLY MEMORY DEVICE AND METHOD FOR FABRICATING THE SAME

BACKGROUND OF THE INVENTION

1. Field of the Invention

The present invention relates in general to electrically erasable programmable read-only memory devices (EEPROMs), and more particularly, to an EEPROM device in which an active region can be scaled down in size, while mitigating misalignment with respect to a tunnel region, so as to enable high integration of the EEPROM device, and a method for fabricating the same.

2. Description of the Prior Art

Generally, an EEPROM is a nonvolatile memory device where data can be erased and/or programmed in response to electrical signals. An EEPROM comprises a plurality of memory cells, each of which is individually erasable or programmable. Each of the memory cells generally comprises two transistors. For example, an EEPROM memory cell of the floating gate tunnel oxide (FLOTOX) type includes a sense transistor and a selection transistor. The selection transistor selects the associated memory cell for an erasing or programming operation, and the sense transistor actually performs the erasing or programming operation of the associated memory cell. For the programming or erasing operation of each cell, a phenomenon typically referred to as electron tunneling is employed to store a positive or negative charge on a floating gate electrode of the sense transistor. The programming operation is performed by applying a positive voltage to a drain of the sense transistor while a control gate of the sense transistor remains grounded. As a result, electrons tunnel from the floating gate of the sense transistor to the drain thereof via a tunnel dielectric film, thereby causing the floating gate to be positively charged. Each EEPROM memory cell is erased by storing a negative charge on the floating gate of the sense transistor. Such storage of the negative charge is typically achieved by applying a positive voltage to the control gate of the sense transistor while grounding the drain and source of the sense transistor. This biasing causes electrons to tunnel from the drain of the sense transistor to the floating gate thereof via the tunnel dielectric film, resulting in the production of the negative charge on the floating gate.

In order to increase memory capacity in the FLOTOX-type EEPROM, there has recently been proposed a method for reducing the memory cell size of the EEPROM while increasing the integration degree thereof. However, such a method is limited in its fabrication process in that it is difficult to scale a reduced-size tunnel region to be aligned with, and overlapped above, the reduced-size active region. In order to overcome this limitation, contemporary EEPROMs are designed by scaling down the active region with no further scaling down of the tunnel region.

FIG. 1 depicts a layout of a conventional EEPROM cell, which is denoted by the reference numeral 10. As shown in this drawing, the EEPROM cell 10 comprises an active region 12 and a field isolation region 14, external to the active region 12. A drain region 16 and source region 18 of the EEPROM cell 10 are formed in the active region 12. A source/drain region 17 is formed in a portion of the active region 12 between a selection gate 36 of a selection transistor and a floating gate 22 of a sense transistor. The source/drain region 17 operates in common as both a source of the cell selection transistor and a drain of the cell sense transistor. The EEPROM cell 10 further comprises a tunnel ion implanted region 20, which overlaps the active region 12 and field isolation region 14.

In the above-mentioned conventional EEPROM cell 10, a tunnel region 32 can be obtained by patterning a tunnel opening for the tunnel region 32 on a gate dielectric film to expose a portion of the active region 12 on the substrate and then growing or depositing a tunnel dielectric film on the exposed active region portion to a thickness of 50–100 Å. The active region 12 has the same width throughout the entire area overlapped by the floating gate 22. Also, the active region 12 is wide enough to prevent any misalignment with the tunnel region 32.

However, in the case where the active region 12 is reduced, or scaled down, in size, the margin of overlap G1 of the active region 12 with respect to the tunnel region 32 is reduced, thus increasing the likelihood of misalignment between the active region 12 and tunnel region 32. As a result, the tunnel region 32 is likely to overlap both the active region 12 and field isolation region 14, or the tunnel dielectric film in the tunnel region 32 may be formed to overlap both the active region 12 and field isolation region 14, thereby raising the possibility that the tunnel dielectric film will be degraded in quality. As a consequence, faulty conditions may arise, where the EEPROM cell is inconsistently or inaccurately programmed, the cell threshold voltage Vth is not constant in level, and device lifetime may be adversely affected.

SUMMARY OF THE INVENTION

In view of the above limitations, it is an object of the present invention to provide an EEPROM device and method for fabricating the same in which an active region can be scaled down in size while mitigating and/or eliminating misalignment with respect to a tunnel region, resulting in a reduction in cell size.

In accordance with one aspect of the present invention, the above and other objects are accomplished by an electrically erasable programmable read-only memory device comprising a substrate having an active region, a field isolation region for isolating the active region, and extension areas integrally extended from and interconnected with portions of the active region in the neighborhood of a tunnel region to enlarge an overlap margin between the active region and tunnel region; a tunnel ion implanted region formed in a portion of the active region including the tunnel region; a tunnel dielectric film formed on a portion of the active region corresponding to the tunnel region; a gate dielectric film formed on the remaining portion of the active region except for the portion corresponding to the tunnel region; a floating gate formed in common on the tunnel region a nd active region; a control gate formed on the floating gate via an insulating film; a selection gate formed on the gate dielectric film at a predetermined distance from the control gate; and a source region, a drain region and a source/drain region being self-aligned with the selection gate and floating gate and formed on the active region.

Preferably, each of the extension areas is of a width that extends to ½ the distance between an edge of said active region and an edge of said floating gate, and of a length that extends on a first end to a middle location between said selection gate and control gate, and on a second end to the source region.

In accordance with another aspect of the present invention, there is provided a method for fabricating an electrically erasable programmable read-only memory device, comprising the steps of forming a field isolation region on an area of a substrate except for an active region to isolate the active region on the substrate and then forming extension areas integrally extended from and interconnected with portions of the active region in the neighborhood of a tunnel region to enlarge an overlap margin between the active region and tunnel region; implanting impurity ions into a portion of the active region including the tunnel region to form a tunnel ion implanted region therein; forming a gate dielectric film on the active region; etching a portion of the gate dielectric film corresponding to the tunnel region to expose an underlying active region portion; forming a tunnel dielectric film on the exposed active region portion; forming a floating gate and an overlying insulating film in common on the tunnel dielectric film and gate dielectric film; and forming a control gate on the floating gate via the insulating film and then forming a selection gate on the gate dielectric film at a predetermined distance from the floating gate.

Preferably, each of the extension areas is of a width that extends to ½ the distance between an edge of said active region and an edge of said floating gate, and of a length that extends on a first end to a middle location between said selection gate and control gate, and on a second end to the source region.

In a feature of the present invention, extension areas are provided to prevent any misalignment between an active region and a tunnel region and, furthermore mitigate degradation in the quality of a tunnel dielectric film even with reduced scaling of the active region. The increased quality of the tunnel dielectric film enables the memory cell to be efficiently programmed and assures the uniformity of the threshold voltage and an excellent endurance, resulting in an increase in product reliability.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
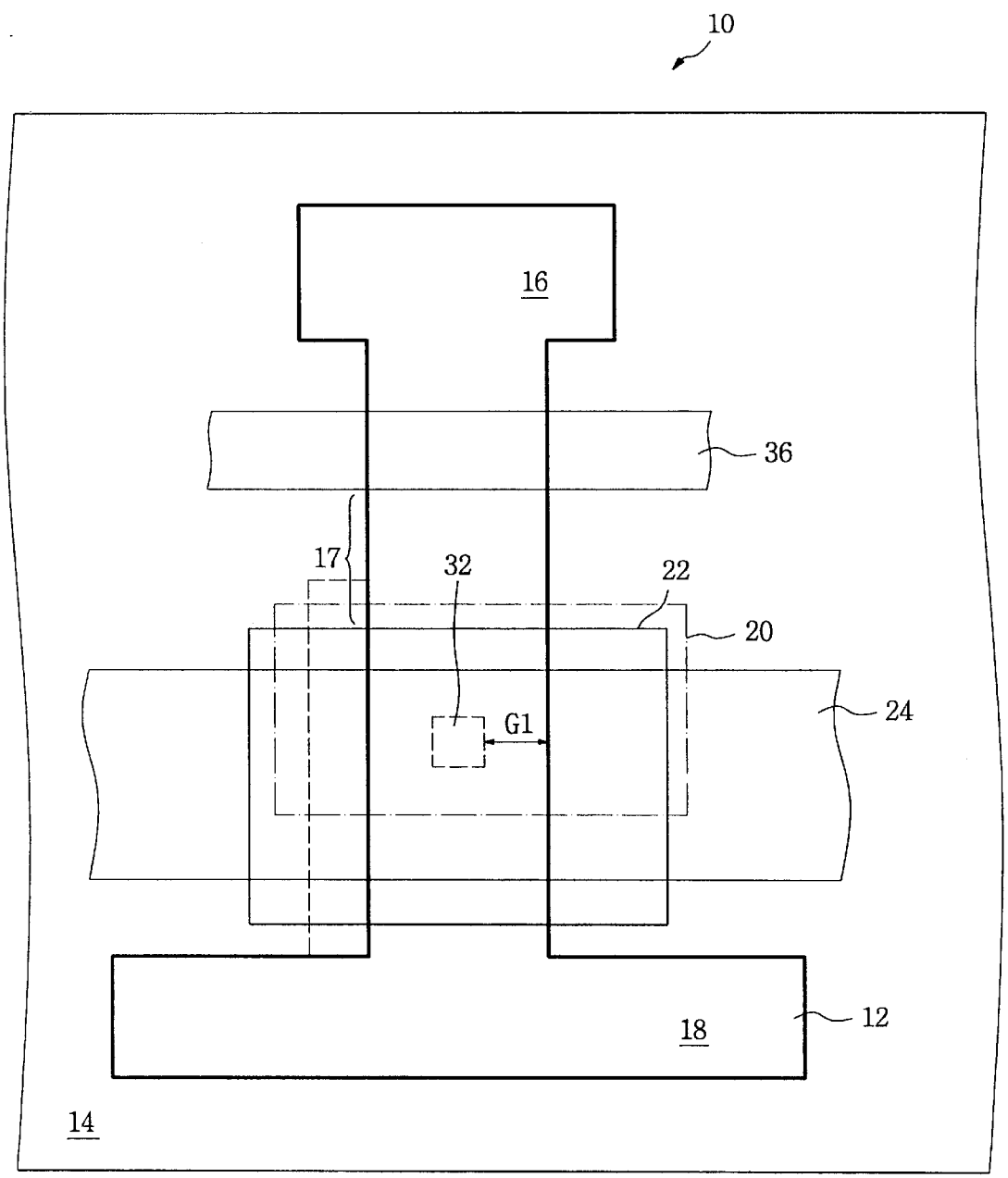
FIG. 1 is a top view of a layout of a conventional EEPROM cell.
Figure 2:
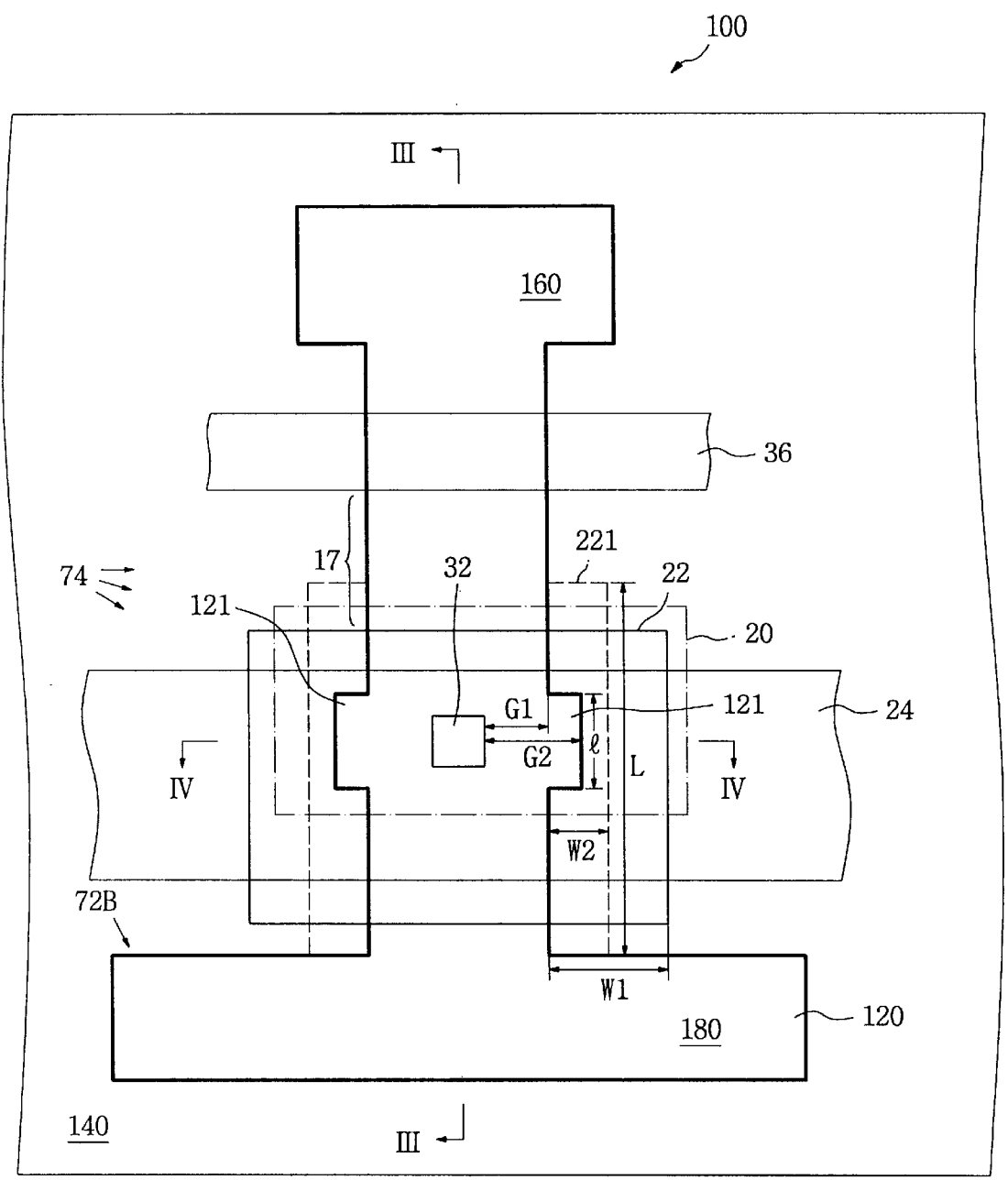
FIG. 2 is a top view of a layout of an EEPROM cell in accordance with the present invention.

A detailed description will now be given of an EEPROM device in accordance with the present invention with reference to FIGS. 2–4. Some parts in these drawings are substantially the same as those in FIG. 1 and the same parts are thus designated by the same reference numerals. FIG. 2 is a top view of a layout of an EEPROM cell in accordance with the present invention, FIG. 3 is a sectional view of the EEPROM cell of FIG. 2, taken along section line III—III, and FIG. 4 is a sectional view of the EEPROM cell of FIG. 2, taken along section line IV—IV.

With reference to FIG. 2, reference numeral 100 denotes an EEPROM cell configured in accordance with the present invention. The EEPROM cell 100 comprises an active region 120 and a field isolation region 140, adjacent with, and external to, the active region 120. A drain region 160 and source region 180 are formed in first and second body portions 72A, 72B respectively of the active region 120. A neck portion of the active region 74 extends longitudinally between the drain region 160 and the source region 180. A source/drain region 17 is formed in the neck portion 74 between the selection gate 36 of the selection transistor and the floating gate 22 of the sense transistor. The source/drain region 17 operates in common as both the source of the cell selection transistor and the drain of the cell sense transistor. The EEPROM cell 100 further comprises a tunnel ion implanted region 20, which at least partially overlaps the source/drain region 17 as shown.

In accordance with the present invention, the neck 74 of the active region 120 includes extension areas 121 for extending its width over a portion of its length. The extensions 121 provide for an enhanced margin of overlap G2 between the active region 120 and the tunnel region 32 that is larger than the margin of overlap G1 of the conventional embodiment of FIG. 1. The extension areas 121 extend from, and are integrally interconnected with, lateral portions of the active region neck 74 in the proximity of the tunnel region 32. In the example of FIGS. 2–4, the neck 74 of the active region 120 is formed to have a extended width along the a length of the neck in the neighborhood of the tunnel region 32 overlapped by the floating gate 22. The extended width is wider than the relatively narrower width of the remaining portion the neck, including the remaining portion overlapped by the floating gate 22. The extension areas 121 can optionally be enlarged, for example widened and/or lengthened, as indicated by dotted lines 221. In this case, each extension area 121 has a second lateral width W2 that is preferably extendable from the neck 74 to ½ of a first lateral width W1 measured between the neck 74 and a corresponding side of the floating gate 22. Each of the extension areas 221 further preferably has a longitudinal length that can range from a first length l, less than the width of the control gate 24, to a second length L that extends from the body of the source region 180 to a position along the neck 74 located in the source/drain region 17 between a control gate 24 for the sense transistor and the selection gate 36 for the selection transistor.

Figure 3:
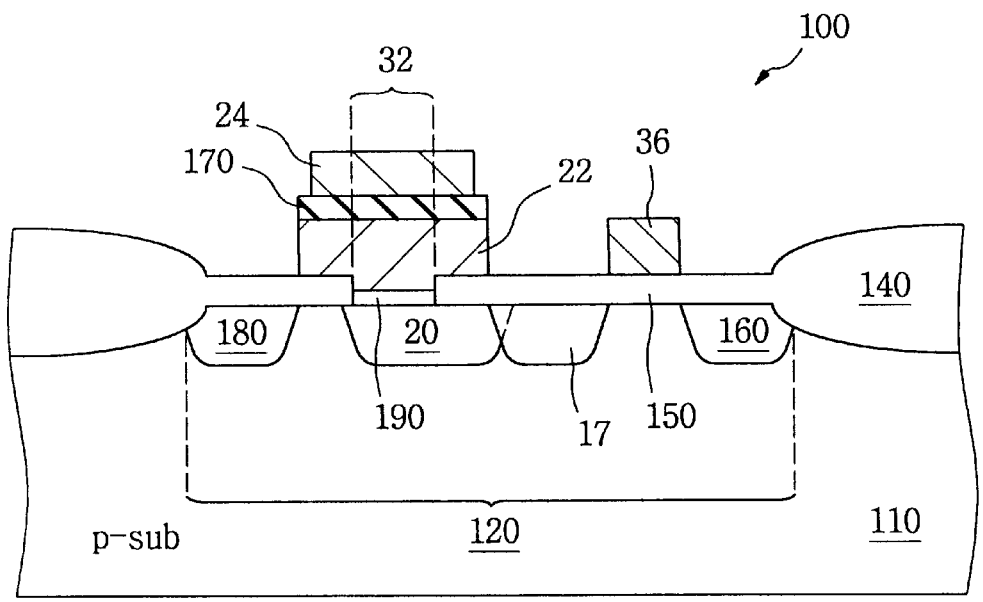
FIG. 3 is a sectional view of the EEPROM cell of FIG. 2, taken along line III—III.
Figure 4:
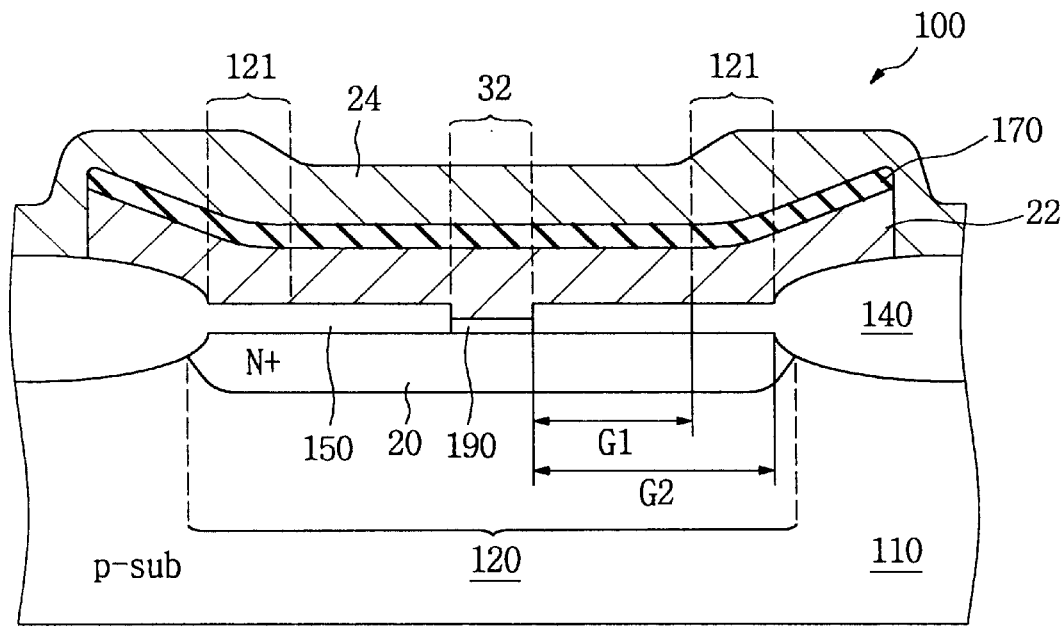
FIG. 4 is a sectional view of the EEPROM cell of FIG. 2, taken along line IV—IV.

With reference to FIG. 3, the EEPROM cell 100 is formed on a substrate 110, for example a P-type substrate, and comprises, for example, silicon or any other semiconductor material. The active region 120 is defined by forming the field isolation region 140 on the substrate 110 through a typical process such as, for example, a local oxidation of silicon (LOCOS) process or a shallow trench isolation (STI).process. A tunnel dielectric film 190 is formed on a portion of the neck 74 of the active region 120 corresponding to the tunnel region 32, and a gate dielectric film 150 is formed on the remaining portion of the active region 120. The floating gate 22 and an overlying insulating film 170 are patterned on the gate dielectric film 150 to overlap the tunnel dielectric film 190. Preferably, the insulating film 170 has an oxide/nitride/oxide (ONO) structure. The control gate 24 is formed on the insulating film 170, and the selection gate 36 is formed on a portion of the gate dielectric film 150 at a predetermined distance from the floating gate 22. The $N^+$-type drain region 160, source region 180 and source/ drain region 17 are formed by implanting N-type impurity ions into the substrate 110 using the floating gate 22 and selection gate 36 as masks. In the fabricated cell, the tunnel ion implanted region 20 is contained in the neck 74 of the active region 120 so far as it overlaps the active region 120 and field isolation region 140 as shown in FIG. 2. The actual doping is localized to an area of the active region 120 on the substrate 110 defined by the tunnel ion implanted region 20 in FIG. 2, because the impurity ions cannot pass through a thick insulating film such as the field isolation region 140 during their implantation into the substrate 110.

With reference to FIG. 4, the tunnel ion implanted region 20 is self-aligned with the field isolation region 140. The tunnel dielectric film 190 is formed on a portion of the tunnel ion implanted region 20 corresponding to the tunnel region 32, and the gate dielectric film 150 is formed on the remaining portion of the tunnel ion implanted region 20. The floating gate 22 and overlying ONO insulating film 170 are patterned in common on the tunnel dielectric film 190, the gate dielectric film 150 and a portion of the field isolation region 140. The control gate 24 is formed to overlap the floating gate 22, and the active region 120 includes the extension areas 121 at their portions between the tunnel region 32 and field isolation region 140. The extension areas 121 operate to make the overlap margin G2 of the active region 120 overlapping the tunnel region 32 larger than the conventional overlap margin G1, as described above.

Therefore, according to the present invention, the active region 120 can be scaled down in size, while mitigating, or avoiding, misalignment with the tunnel region 32. As a result of the extensions, the tunnel region 32 overlaps only the active region 120, and the tunnel dielectric film 190 therein is formed on only the active region 120, instead of the field isolation region 140, so as to increase its quality. The increased quality of the tunnel dielectric film 190 enables the EEPROM cell to be reliably programmed and assures uniformity in threshold voltage Vth and enhanced endurance, resulting in an increase in product reliability.

A method for fabricating the EEPROM cell with the above-mentioned configuration in accordance with the present invention will now be described in detail with reference to FIGS. 5 to 8. Some parts in these drawings are substantially the same as those in FIGS. 2 to 4 and the same parts are thus designated by the same reference numerals. For the convenience of description, the EEPROM cell fabrication method will be mentioned on the basis of FIG. 4 which is the sectional view of the EEPROM cell, taken along the line IV—IV in FIG. 2.

Figure 5:
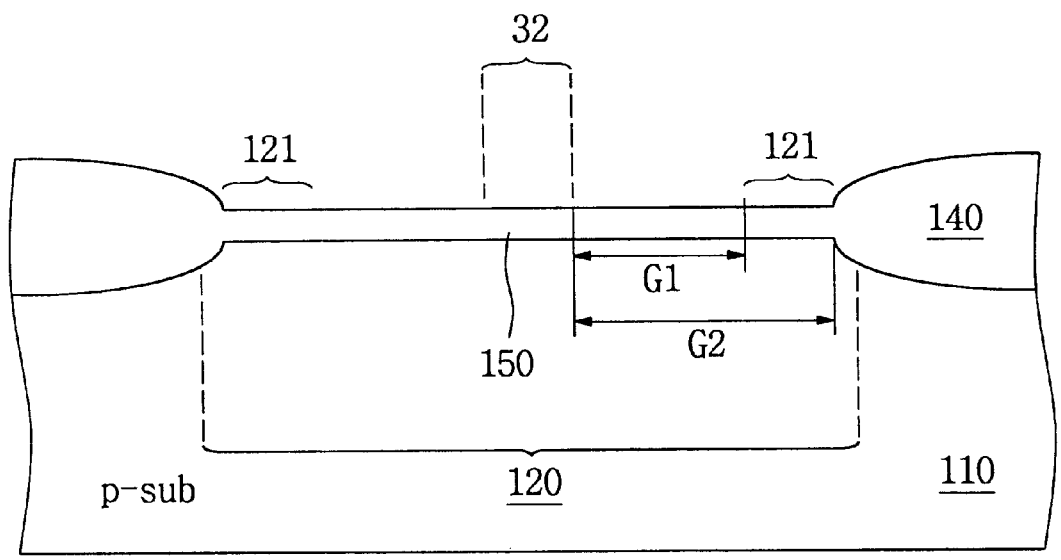
FIGS. 5 to 8 are sectional views illustrating a method for fabricating the EEPROM cell in accordance with the present invention.

With reference to FIG. 5, the active region 120 is first defined by forming the field isolation region 140 on the first conductive type, or P-type, substrate 110 of silicon or any other semiconductor material using, for example, the LOCOS or STI process. As shown in FIG. 2, the active region 120 includes the extension areas 121 for making the overlap margin G2 with the tunnel region 32 to be defined at the subsequent step, larger than the overlap margin G1 in FIG. 1. The extension areas 121 are integrally extended and interconnected at the left and right lateral portions of the neck of the active region 120 in the neighborhood of the tunnel region 32. The active region 120 is formed to have a larger width in the neighborhood of the tunnel region 32 under the floating gate 22 to be formed at the subsequent step, as compared to that at its remaining area under the floating gate 22. The lengths l and widths of the extension areas 121 are expandable to the extension areas 221 indicated by the dotted lines in FIG. 2, each of which has its width W2 extendable up to ½ of the width W1 between the side of the neck 74 of the active region, and the corresponding side of the floating gate 22. The lengths L of the extension areas 221 are extendable to a middle position between the control gate 24 and selection gate 36 in the source drain region 17 on one end and to the common source region 180 on the other end.

Subsequently, the gate dielectric film 150, such as an oxide film, is formed on the active region 120 to a thickness of ~300 Å through, for example, a thermal oxidation process.

Figure 6:
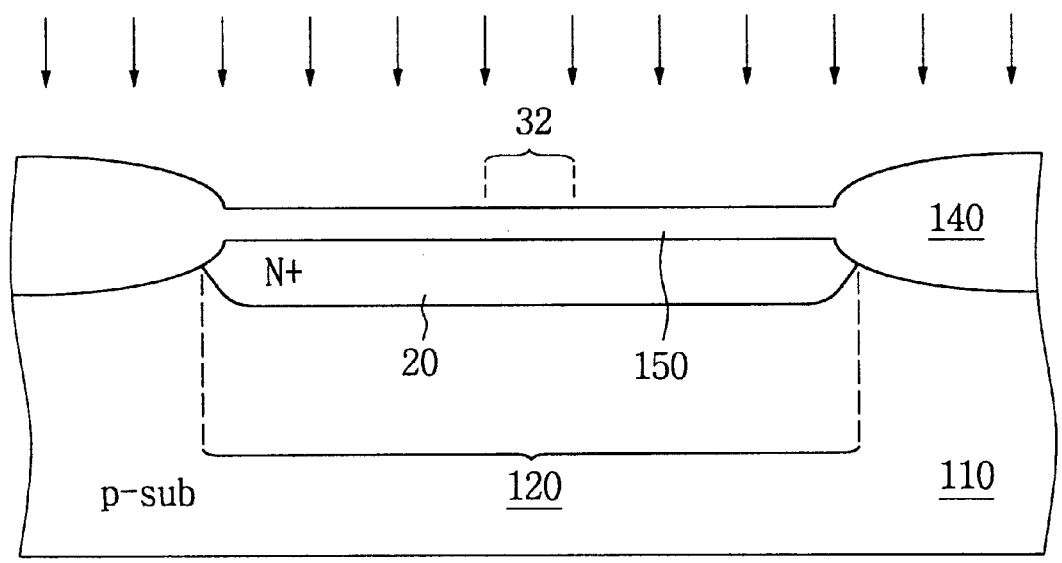

With reference to FIG. 6, after the formation of the gate dielectric film 150 has been completed, a photoresist (not shown) is formed which has an opening corresponding to the tunnel ion implanted region 20 which overlaps together the active region 120, the field isolation region 140 and a portion of the source/drain region 17 to be formed at the subsequent step, as shown in FIG. 2. Then, the tunnel ion implanted region 20 is formed by implanting second conductive type, or N-type, impurity ions such as, for example, phosphorus (P) into the substrate 110 using the photoresist as a mask. In the fabricated cell, the tunnel ion implanted region 20 is contained in the active region 120 so far as it overlaps the active region 120 and field isolation region 140 as shown in FIG. 2. Because the impurity ions cannot pass through a thick insulating film such as the field isolation region 140 during their implantation into the substrate 110, the actual doping is localized to an area of the active region 120 on the substrate 110 defined by the tunnel ion implanted region 20 in FIG. 2.

Figure 7:
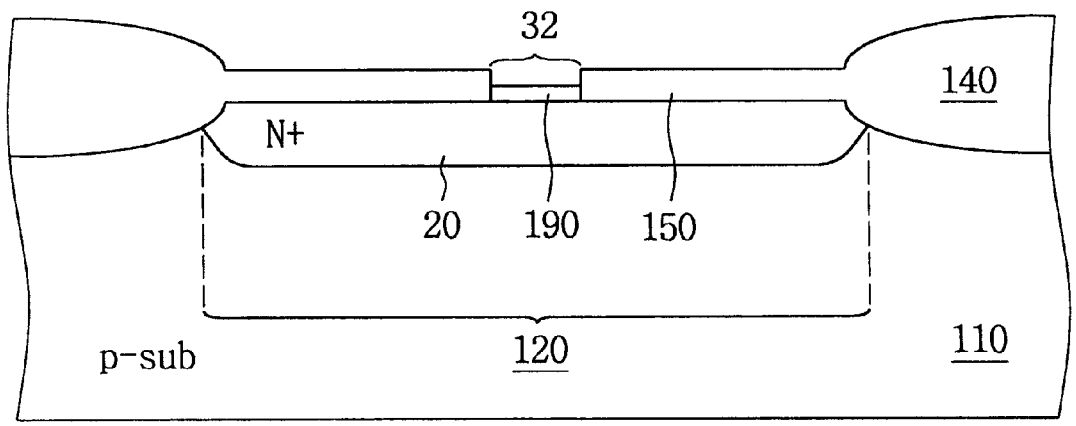

With reference to FIG. 7, the gate dielectric film 150 in the tunnel region 32 is photoetched to partially expose the underlying tunnel ion implanted region 20. The tunnel dielectric film 190 is then grown through a thermal oxidation process or deposited through a chemical vapor deposition method on an exposed portion of the tunnel ion implanted region 20 to a thickness of 70 Å.

Figure 8:
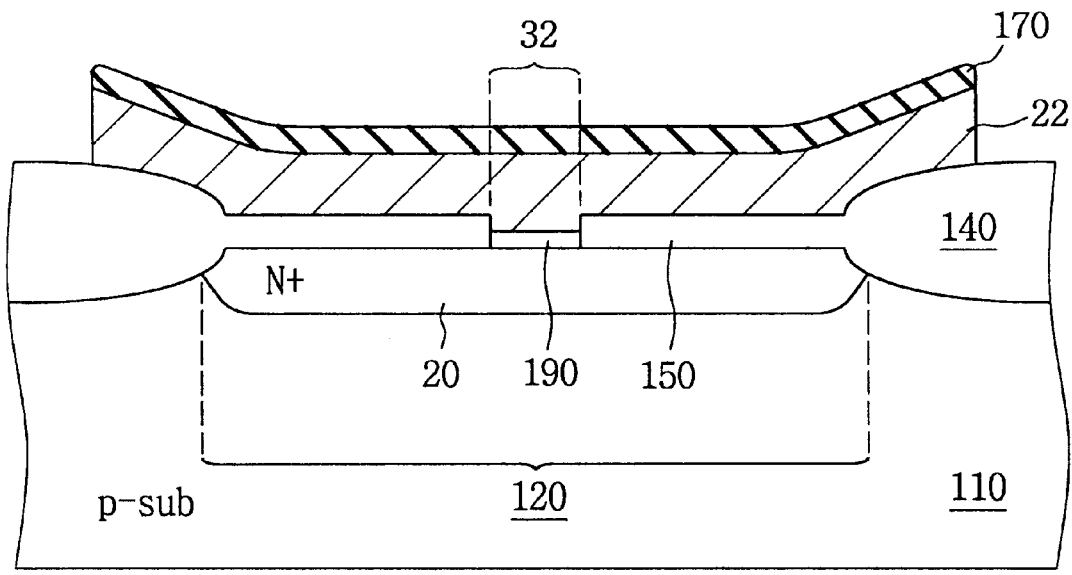

With reference to FIG. 8, after the formation of the tunnel dielectric film 190 is completed, a conductive layer for the floating gate 22 such as, for example, a polysilicon layer is deposited to a thickness of 1000 Å on the entire surface of the resultant structure including the tunnel dielectric film 190 and gate dielectric film 150 and is then doped with a dopant such as, for example, $POCl_3$. Subsequently, the O/N/O insulating film 170 is deposited on the doped polysilicon layer to a thickness of 200 Å. It is preferred to form the middle nitride layer of the insulating film 170 to a thickness of ~120 Å, the upper oxide layer thereof to a thickness of ~80 Å and the lower oxide layer thereof to a thickness of ~50 Å, respectively. On the other hand, in order to reduce a resistance of the polysilicon layer for the floating gate 22, a silicide layer may be formed on the polysilicon layer, for example, a tungsten silicide layer or any other possible silicide layer.

Thereafter, the floating gate 22 and the overlying insulating film 170 are patterned as shown in FIG. 2 by partially photoetching the polysilicon layer for the floating gate 22 and the insulating film 170.

Subsequently, a conductive layer for the control gate 24 and selection gate 36 such as, for example, a polysilicon layer is deposited on the entire surface of the resultant structure including the insulating film 170 and then photo-etched to pattern the control gate 24 and selection gate 36 as shown in FIGS. 2 and 3. As seen in FIGS. 2 and 3, the control gate 24 is formed to horizontally intersect the floating gate 22 while overlapping it, and the selection gate 36 is formed to horizontally intersect the gate dielectric film 150 at a predetermined distance from the control gate 24. In a similar manner to the floating gate 22, in order to reduce a resistance of the polysilicon layer for the control gate 24, a silicide layer may be formed on the polysilicon layer such as, for example, a tungsten silicide layer or any other possible silicide layer.

Next, the self-aligned source region 180, drain region 160 and source/drain region 17 are formed by implanting N-type impurity ions into the substrate 110 using the floating gate 22 and selection gate 36 as masks, completing the process of fabricating the configuration of the present invention.

Finally, although not shown, inter-layer insulating films are deposited on the above resultant structure, and contact and metal wiring processes are performed to electrically interconnect desired components via contacts of the inter-layer insulating films. Subsequently, a protective layer for metal wires is deposited on each inter-layer insulating film including the metal wires.

As apparent from the above description, according to the present invention, the extension areas are integrally extended and interconnected at the portions of the active region in the neighborhood of the tunnel region to enhance the overlap margin between the active region and tunnel region.

The extension areas act to prevent any misalignment between the active region and tunnel region and, furthermore, prevent degradation in the quality of the tunnel dielectric film even though the active region is scaled down to reduce the size of the EEPROM cell. The increased quality of the tunnel dielectric film enables the EEPROM cell to be reliably programmed and assures the uniformity of a threshold voltage and heightened product endurance. In this manner, the configuration of the present invention has the effect of enhancing the product reliability.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. An electrically erasable programmable read-only memory device comprising:
   a substrate having an active region and a field isolation region for isolating said active region, the active region including extension areas integrally extended from and interconnected with portions of said active region in the neighborhood of a tunnel region to enlarge an overlap margin between said active region and tunnel region;
   a tunnel ion implanted region formed in a portion of said active region including said tunnel region;
   a tunnel dielectric film formed on a portion of said active region corresponding to said tunnel region;
   a gate dielectric film formed on the remaining portion of said active region except for said portion corresponding to said tunnel region;
   a floating gate formed in common on said tunnel region and active region;
   a control gate formed on an insulating film over said floating gate;
   a selection gate formed on said gate dielectric film at a predetermined distance from said control gate; and
   a source region, a drain region and a common source/drain region being aligned with said selection gate and floating gate and formed on said active region.

2. An electrically erasable programmable read-only memory device as set forth in claim 1, wherein each of said extension areas is of a width that extends to ½ the distance between an edge of said active region and an edge of said floating gate.

3. An electrically erasable programmable read-only memory device as set forth in claim 1, wherein each of said extension areas is of a length that extends on a first end to a middle location between said selection gate and control gate, and on a second end to the source region.

4. A method for fabricating an electrically erasable programmable read-only memory device, comprising the steps of:
   a) forming a field isolation region on an area of a substrate except for an active region to isolate said active region; said active region formed to include extension areas integrally extended from and interconnected with portions of said active region in the neighborhood of a tunnel region to enlarge an overlap margin between said active region and tunnel region;
   b) implanting impurity ions into a portion of said active region including said tunnel region to form a tunnel ion implanted region therein;
   c) forming a gate dielectric film on said active region;
   d) etching a portion of said gate dielectric film corresponding to said tunnel region to expose an underlying active region portion;
   e) forming a tunnel dielectric film on the exposed active region portion;
   f) forming a floating gate and an overlying insulating film in common on said tunnel dielectric film and gate dielectric film; and
   g) forming a control gate on said floating gate via said insulating film and then forming a selection gate on said gate dielectric film at a predetermined distance from said floating gate.

5. A method as set forth in claim 4, wherein each of said extension areas is of a width that extends to ½ the distance between an edge of said active region and an edge of said floating gate.

6. A method as set forth in claim 4, wherein each of said extension areas is of a length that extends on a first end to a middle location between said selection gate and control gate, and on a second end to the source region.

* * * * *